United States Patent
Mehrpoo et al.

(10) Patent No.: US 10,892,935 B2
(45) Date of Patent: Jan. 12, 2021

(54) DIGITALLY-INTENSIVE TRANSMITTER HAVING WIDEBAND, LINEAR, DIRECT-DIGITAL RF MODULATOR

(71) Applicant: Technische Universiteit Delft, Delft (NL)

(72) Inventors: Mohammed Reza Mehrpoo, Delft (NL); Leonardus Cornelis Nicolaas de Vreede, Delft (NL); Seyed Morteza Alavi, Delft (NL)

(73) Assignee: Technische Universiteit Delft, Delft (NL)

( * ) Notice: Subject to any disclaimer, the term of this patent is extended or adjusted under 35 U.S.C. 154(b) by 0 days.

(21) Appl. No.: 16/618,179

(22) PCT Filed: May 30, 2018

(86) PCT No.: PCT/EP2018/064222
§ 371 (c)(1),
(2) Date: Nov. 29, 2019

(87) PCT Pub. No.: WO2018/220035
PCT Pub. Date: Dec. 6, 2018

(65) Prior Publication Data
US 2020/0112471 A1    Apr. 9, 2020

(30) Foreign Application Priority Data
May 30, 2017    (NL) ........................................ 2018990

(51) Int. Cl.
*H04B 1/04*        (2006.01)
*H04L 27/36*       (2006.01)

(52) U.S. Cl.
CPC ............. *H04L 27/365* (2013.01); *H04B 1/04* (2013.01); *H04L 27/364* (2013.01); *H04B 2001/0408* (2013.01); *H04B 2001/0491* (2013.01)

(58) Field of Classification Search
CPC ... H04L 27/365; H04L 27/364; H04L 27/366; H04L 27/32; H04B 1/04; H04B 2001/0408; H04B 2001/0491
See application file for complete search history.

(56) References Cited

U.S. PATENT DOCUMENTS

| | | | | |
|---|---|---|---|---|
| 2014/0159933 A1* | 6/2014 | Dufrene | ................. | H03M 1/66 341/144 |
| 2014/0254722 A1* | 9/2014 | Morris | ................ | H03M 7/3028 375/324 |

(Continued)

OTHER PUBLICATIONS

Alavi et al., "A Wideband 2 X13-bit All-Digital I/Q RF-DAC", IEEE Transactions on Microwave Theory and Techniques, Plenum, USA, vol. 62, No. 4, Apr. 1, 2014 (Apr. 1, 2014), pp. 732-752, XP011544292, ISSN: 0018-9480, DOI: 10.1109/TMTT.2014. 2307876 [retrieved on Apr. 2, 2014] abstract, sec. IV.A.; figures 1,3(a),4,5(a).

(Continued)

*Primary Examiner* — Dac V Ha
(74) *Attorney, Agent, or Firm* — N.V. Nederlandsch OCtrooibureau; Catherine A. Shultz; Katelyn J. Bernier

(57) ABSTRACT

A wideband, linear, direct-digital RF modulator (DDRM) for a digitally-intensive transmitter (DTX) includes an interpolation filter and an in-phase/quadrature (I/Q)-interleaving RF digital-to-analog converter (RF-DAC). The interpolation filter suppresses sampling replicas in the DDRM's output RF spectrum. I/Q interleaving performed by the interleaving RF-DAC avoids problems associated with using two separate I- and Q-path RF-DACs. Each unit cell of the inter- (Continued)

leaving RF-DAC is capable of producing four unique non-overlapping waveforms covering all four quadrants of the I/Q signal plane. In one embodiment of the invention, the interleaving RF-DAC includes three parallel-connected RF-DACs operating in accordance with a multi-phase set of LO clocks to both cancel $3^{rd}$-order and $5^{th}$-order LO harmonics generated by the RF-DAC unit cells' interleaving logic and prevent $3^{rd}$-order intermodulation from occurring in the DTX's final stage RF power amplifier.

19 Claims, 14 Drawing Sheets

(56) References Cited

U.S. PATENT DOCUMENTS

| | | | |
|---|---|---|---|
| 2018/0191368 A1* | 7/2018 | Lye | H04B 1/0475 |
| 2018/0302111 A1* | 10/2018 | Chen | H04B 1/525 |
| 2018/0331691 A1* | 11/2018 | Monga | H03M 1/661 |

OTHER PUBLICATIONS

Deng et al., "A Dual-Band Digital-WiFi 802.11a/b/g/n Transmitter SoC with Digital I/Q Combining and Diamond Profile Mapping for Compact Die Area and improved Efficiency in 40nm CMOS", 2016 IEEE International Solid-State Circuits Conference (ISSCC), IEEE, Jan. 31, 2016 (Jan. 31, 2016), pp. 172-173, XP032873558, DOI: 10.1109/ISSCC.2016.7417962 ISBN: 978-1-4673-9466-6 [retrieved on Feb. 23, 2016].

Weldon et al., "A 1.75GHz Highly-Integrated Narrow-Band CMOS Transmitter with Harmonic-Rejection Mixers", Solid-State Circuits Conference, 2001. Digest of Technical Papers. ISS CC. 2001 IEEE International Feb. 5-7, 2001, Piscataway, NJ, USA,IEEE, Piscataway, NJ, USA, Feb. 7, 2001 (Feb. 7, 2001), pp. 160-161, XP032403486, DOI: 10.1109/ISSCC.2001.912586, ISBN: 978-0-7803-6608-4 figure 10.4.1.

* cited by examiner

DIGITALLY-INTENSIVE TRANSMITTER HAVING WIDEBAND, LINEAR, DIRECT-DIGITAL RF MODULATOR

BACKGROUND OF THE INVENTION

Radio frequency (RF) transmitters are used in basestations, cellular handsets, smartphones, tablets, laptops, etc. to transmit voice and/or data to RF receivers. In general, as illustrated in FIG. 1, an RF transmitter 100 is comprised of three primary components: a modulator 102, an RF power amplifier (RF PA) 104, and an antenna 106. The modulator 102 serves to modulate the voice or data to be transmitted onto an RF carrier having a frequency capable of 'carrying' the voice or data over the air to a remote receiver, such as a cellular base station, Wi-Fi hotspot, or Bluetooth receiver, as the case may be, and the RF PA 104 operates to increase the RF power of the modulated RF carrier, just prior to being radiated by the antenna 106, in order to compensate for attenuation the RF carrier experiences as it propagates to the receiver.

Traditionally, RF transmitters have been designed entirely from (or mostly from) analog components. However, due to the ever-increasing demand for low-cost, compact, and energy efficient RF transmitters, particularly in battery-powered applications, "digitally-intensive" transmitters (DTXs) have been developed that are constructed mostly from digital circuits. DTXs can be manufactured at much higher levels of integration than analog-intensive transmitters, and benefit from technology scaling, unlike analog-intensive transmitters in which the analog components are not normally scalable.

Various DTX architectures have been proposed in recent years. FIG. 2 is a drawing showing the basic components of a direct-conversion DTX 200. The direct conversion DTX 200 comprises in-phase (I) and quadrature (Q) RF digital-to-analog converters (RF-DACs) 202 and 204; an RF band-pass filter (BPF) 206; an RF PA 208; and an antenna 210. The I and Q RF-DACs 202 and 204 serve to separately upconvert input I and Q digital baseband signals into I and Q digital RF signals and separately convert their respective digital RF signals to analog I and Q RF waveforms. The I and Q RF waveforms are then summed, filtered by the RF BPF 206 to suppress out-of-band spurious emissions, translated to higher RF power by the RF PA 208, and finally radiated by the antenna 210.

FIG. 3 is a drawing that further illustrates how the I and Q RF-DACs 202 and 204 operate to translate the input I and Q digital baseband signals to RF and then convert the digital I and Q RF signals to analog RF waveforms. In the I-path, a switching mixer 212 mixes the incoming I digital baseband signal with an in-phase local oscillator (LO) $CK_I$ at carrier frequency $f_c = f_{LO}$, to thereby upconvert the I digital baseband signal to RF. The upconverted I digital signal is then converted to the analog in-phase RF waveform by an I-path DAC 214 operating at RF. Similarly, in the Q-path, a switching mixer 216 mixes the incoming Q digital baseband signal with a 90° phase-shifted version of the LO $CLK_Q$ and a Q-path DAC 218 converts the upconverted digital Q signal to the analog quadrature RF waveform. The analog in-phase and quadrature RF waveforms are then summed by a summer 220, to produce the final modulated RF waveform $RF_{OUT}$.

From the foregoing description, it should be clear that together the switching mixers 212 and 216 and DACs 214 and 218, which make up the RF-DACs 202 and 204 in FIG. 2, and summer 220 correspond to the modulator block 102 in FIG. 1, and that modulation and upconversion to RF is performed digitally in a single frequency translation step. For this reason, the combination of the I and Q RF-DACs 202 and 204 and summer 220 is often referred to in the art as a direct-digital RF modulator or "DDRM."

Compared to more-conventional analog-intensive approaches, the DDRM 300 depicted in FIG. 3 is more amenable to being manufactured in integrated circuit technology. For example, it can be readily manufactured using commonly available complementary metal-oxide-semiconductor (CMOS) integrate circuit (IC) technology. In fact, the feasibility of manufacturing DDRMs in state-of-the-art nanoscale CMOS technology has been repeatedly demonstrated in recent years. The DDRM's digital architecture also benefits from CMOS scaling.

Although the DDRM 300 has many appealing attributes, it does present a few problems. First, as shown in FIG. 4A, absent any filtering, sampling replicas (i.e., sampling 'aliases' or 'spurs') occur in the DDRM's RF output spectrum. These sampling replicas are undesirable since they can make it difficult to comply with spectral mask requirements imposed by communications standards. One approach that can be used to suppress the sampling replicas is to resample the input I and Q digital baseband signals to a high upsampling rate. Unfortunately, the upsampling rate that is needed is often high, particularly in wideband applications, and the high upsampling rate increases power consumption more than desired.

Second, the upconversion process performed by the switching mixers 212 and 216 in the RF-DACs 202 and 204 produces scaled copies of the baseband signal at odd multiples (i.e., odd harmonics) of the LO frequency away from the LO frequency $f_{LO}$. These scaled copies of the baseband signal are undesirable since they contribute to out-of-band emissions in the DDRM's output RF spectrum. In an effort to suppress these out-of-band emissions, a pre-PA RF BPF 206 (see FIG. 2) and/or a post-PA RF BPF (not shown in FIG. 2) is/are often used. Unfortunately, high quality factor (high Q) RF BPFs are difficult to design, are usually large and bulky, and are difficult to integrate. These negative attributes makes pre- and post-PA BPFs unattractive, especially in circumstances where the DTX is designed for use in a small hand-held device, such as cellular handset.

Third, and as illustrated in the transition between FIGS. 4A and 4B, the $3^{rd}$ LO harmonic tends to intermodulate with the fundamental component of the DDRM output RF waveform as the signals pass through the RF PA 210. This intermodulation is undesirable since it produces what is referred to as third-order counter-intermodulation distortion (C-IMD3). C-IMD3 is of particular concern in multi-band/carrier aggregation telecommunications applications, such as Long Term Evolution (LTE) Advanced, where carriers can be allocated up to +/−50 MHz away from $f_{LO}$. As illustrated in the output RF spectrum of the RF PA 210 in FIG. 4B, the C-IMD3 emissions spectra is centered around $f_{LO} - 3 \times f_{in}$ and can fall very near, or even overlap with, the restricted transmission band. C-IMD3 is not easily prevented using conventional RF filtering techniques and therefore can have a deleterious effect on the modulation accuracy of the DTX 200.

Finally, the conventional DDRM approach of using two separate I-path and Q-path RF-DACs 202 to generate separate analog I and Q RF waveforms and then combining (summing) the analog I and Q RF waveforms in the analog domain presents additional problems. Such an approach renders the conventional DDRM 300 prone to I-path/Q-path mismatch, which compromises the DDRM's intrinsic image rejection capability. Moreover, the need for two separate RF-DACs 202 and 204 to produce the I/Q modulated RF waveform results in a larger-than-desired DDRM footprint and excessive output parasitics that can adversely affect the DTX's linearity and realizable energy efficiency.

The article by S. Alavi Morteza and L. C. N. de Vreede 'A wideband 2×13-bit All-Digital I/Q RF-DAC', IEEE Transactions on microwave theory and techniques, vol. 62, no. 4, April 2014, discloses a wideband I/Q RF digital-to-analog converter-based all digital modulator, which was realized in a 65 nm CMOS process. Linearization may be implemented using either of two digital pre-distortion approaches.

The article by J. A. Weldon et al. '! 1.75 GHz highly-integrated narrow-band CMOS transmitter with harmonic-rejection mixers' presented on the 2001 IEEE International Solid-State Circuits Conference, discloses a highly-integrated, low-cost transmitter implementation, using two baseband signal paths, an image/harmonic-rejection up-conversion mixer, a channel-selection IF synthesizer, a fixed-frequency RF synthesizer and two quadrature generation circuits.

SUMMARY OF THE INVENTION

A digitally-intensive radio frequency (RF) transmitter (DTX) having a wideband, linear, direct-digital RF modulator (DDRM) is disclosed. In one embodiment of the invention the DDRM includes a $2^{nd}$-order-hold (SOH) interpolation filter and an in-phase/quadrature (I/Q)-interleaving RF digital-to-analog converter (RF-DAC). The SOH interpolation filter suppresses sampling replicas in the DDRM's output RF spectrum. I/Q interleaving performed by the interleaving RF-DAC avoids problems associated with using two separate I- and Q-path RF-DACs. Each unit cell of the interleaving RF-DAC is capable of producing four unique non-overlapping waveforms covering all four quadrants of the I/Q signal plane. In one embodiment of the invention, the interleaving RF-DAC comprises three parallel-connected RF-DACs operating in accordance with a multi-phase set of LO clocks to both cancel $3^{rd}$-order and $5^{th}$-order LO harmonics generated by the RF-DAC unit cells' interleaving logic and prevent $3^{rd}$-order intermodulation from occurring in the DTX's final stage RF power amplifier.

Further features and advantages of the invention, including a detailed description of the above-summarized and other exemplary embodiments of the invention, will now be described in detail with respect to the accompanying drawings, in which like reference numbers are used to indicate identical or functionally similar elements.

DETAILED DESCRIPTION

Figure 5:
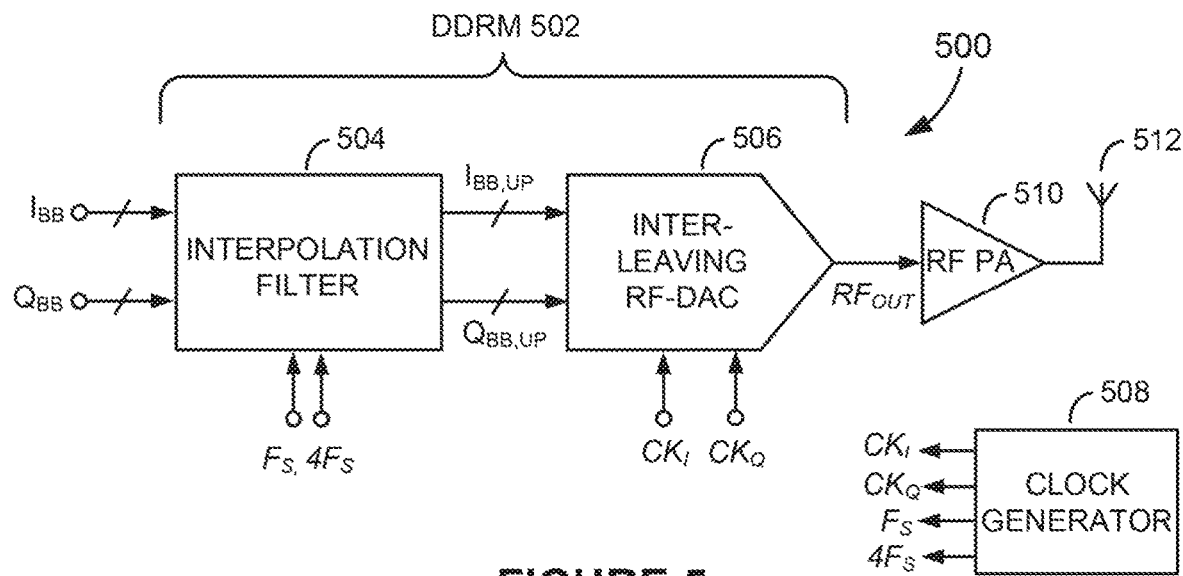
FIG. 5 is a simplified drawing of a digitally-intensive transmitter (DTX), according to an embodiment of the present invention.

Referring to FIG. 5, there is shown a digitally-intensive transmitter (DTX) 500, according to an embodiment of the present invention. The DTX 500 comprises a digital radio frequency (RF) modulator (DDRM) 502 that includes an interpolation filter 504 and interleaving RF-DAC 506; a clock signal generator 508; an RF power amplifier (RF PA) 510; and an antenna 512. The DTX 500 in this exemplary embodiment of the invention is a direct-conversion transmitter, meaning that the interleaving RF-DAC 506 interleaves and translates the digital input in-phase (I) and quadrature (Q) baseband signals directly to RF, without an intermediate frequency conversion step. While a direct-conversion DTX architecture is preferred, the methods and apparatus of the present invention could be modified or adapted for use in an indirect-conversion DTX architecture. In such an approach the interleaving RF-DAC 506 would interleave and translate the I and Q baseband signals to some intermediate frequency, and a subsequent analog RF mixer would then upconvert the IF waveform to the final desired RF carrier frequency.

The interpolation filter 504 of the DDRM 502 in the DTX 500 serves to upsample the N-bit digital input I and Q digital baseband signals of sample rate $F_s$ to an upsampled rate $f_c = f_{LO} = M \times F_s$, where N is the number of bits in (i.e., resolution op the digital input I and Q input baseband signals, M is the upsampling factor, and $f_c = f_{LO}$ is the frequency of the DDRM local oscillator (LO) clocks provided by the clock signal generator 508. The interpolation filter 504 also serves as a digital low-pass filter (LPF) with a cut-off frequency designed to suppress sampling replicas in the DDRM's RF output spectrum. The sampling frequency $F_s$ and the upsampling factor M are selected during design to realize a desired combination of replica separation, data path power consumption, and filter complexity.

Figure 6:
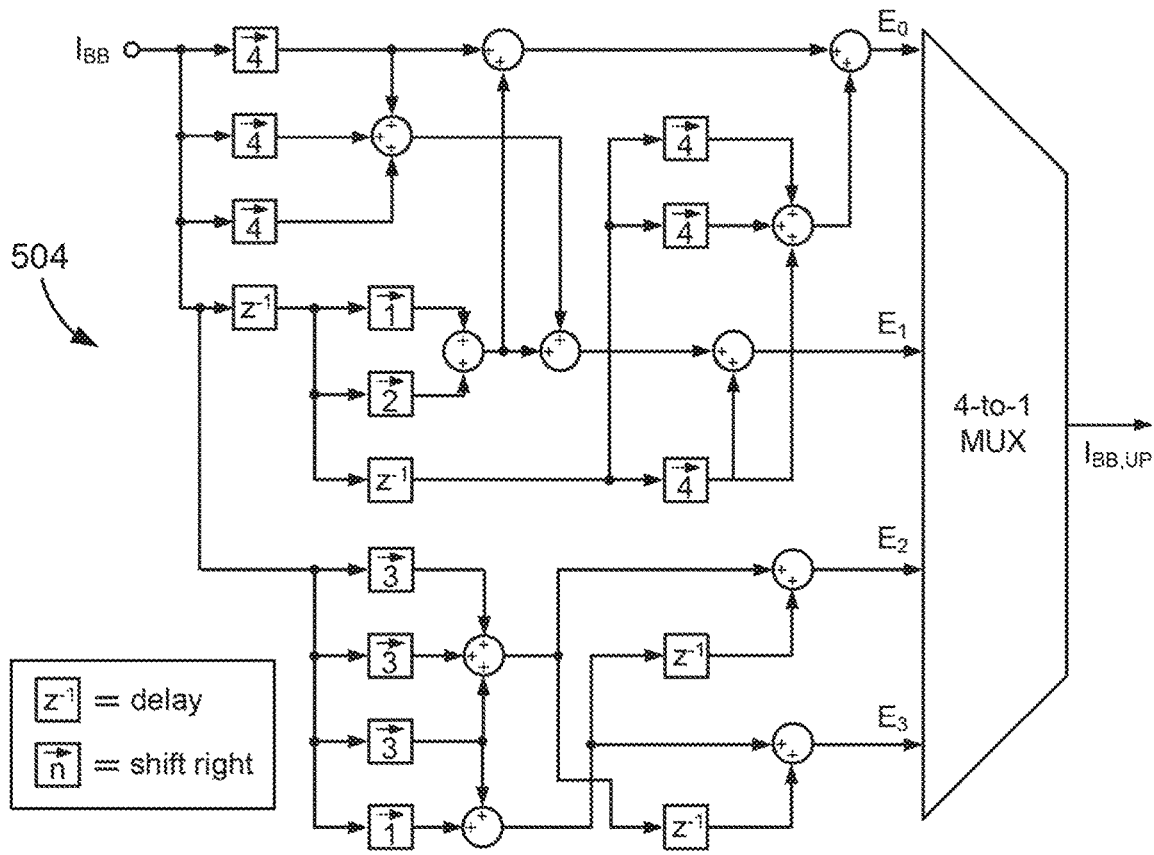
FIG. 6 is a block diagram of the in-phase portion of an exemplary $2^{nd}$-order hold (SOH) polyphase interpolation filter that may be used in the DDRM of the DTX depicted in FIG. 5.
Figure 7:
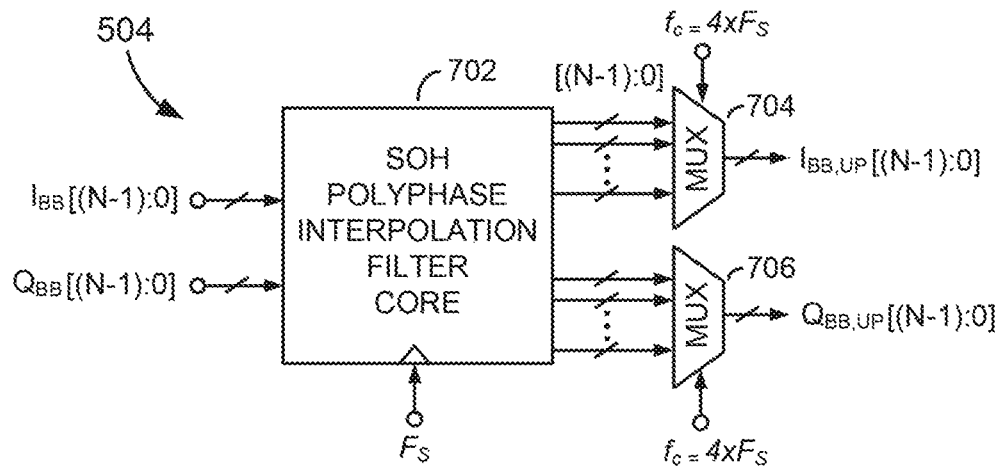
FIG. 7 is a simplified block diagram of the SOH polyphase interpolation filter depicted in FIG. 6, highlighting the fact that the filter core operates at a low sample rate of $F_s$ and only the I and Q output multiplexers of the filter operate at the upsampled rate of $M \times F_s$.

In one embodiment of the invention, the interpolation filter 504 comprises a $2^{nd}$-order hold (SOH) polyphase interpolation filter with an upsampling factor of M=4. As illustrated in FIG. 6, the SOH polyphase interpolation filter 504 comprises four parallel finite impulse response (FIR) sub-filters and contains no multipliers. (Note that only the in-phase portion of the filter is shown in FIG. 6. The quadrature portion has a substantially similar construction.) As better indicated in FIG. 7, the four parallel FIR sub-filters are configured to operate at the lower sample rate of $F_s$ and only output multiplexers 704 and 706 operate at $4 \times F_s$. The lower sampling rate $F_s$ used by the filter core 702 minimizes the filter's overall power consumption yet still allows the input I and Q the N-bit digital input I and Q digital baseband signals $I_{BB}[(N-1):0]$ and $Q_{BB}[(N-1):0]$ to be upsampled to the desired upsample rate $4 \times F_s$. It should be mentioned that whereas a SOH interpolation filter is employed in this particular exemplary embodiment of the invention, interpolation filters of even higher order can be alternatively used, such as a 3rd-order hold, for example.

Figure 8:
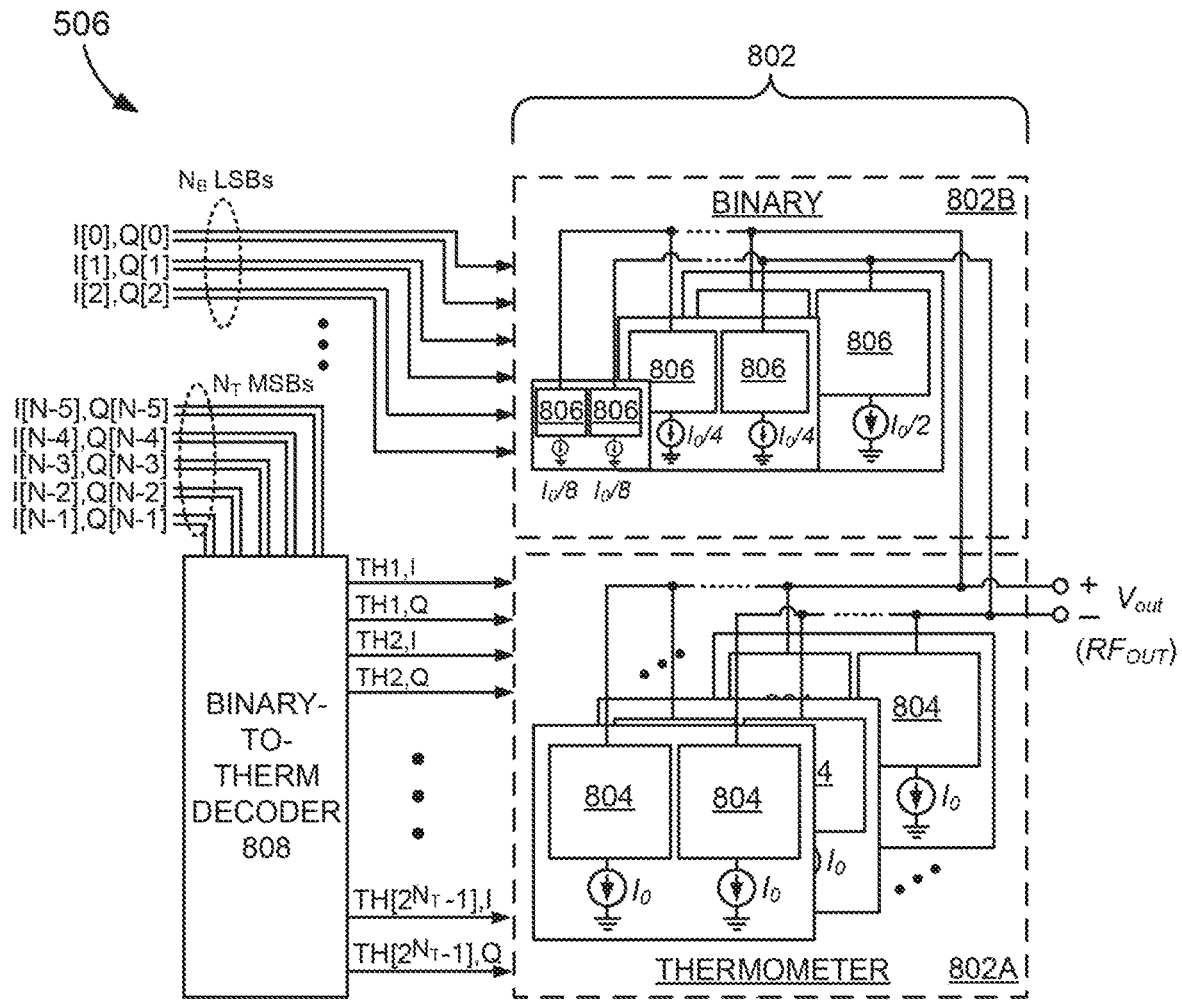
FIG. 8 is a more detailed depiction of the interleaving RF-DAC in the DDRM of the DTX depicted in FIG. 5.

FIG. 8 is a more detailed depiction of the interleaving RF-DAC 506 of the DDRM 502. The interleaving RF-DAC 506 comprises a plurality (or 'array') of interleaving RF-DAC unit cells 802 that share a common output and collectively operate according to the current-steering principle. In this exemplary embodiment of the invention the interleaving RF-DAC 506 is segmented, with a first plurality 802A of the plurality of interleaving RF-DAC unit cells 802 being thermometer-coded interleaving RF-DAC unit cells 804 and a second plurality 802B of the plurality of interleaving RF-DAC unit cells 802 being binary-coded interleaving RF-DAC unit cells 806. The $N_T$ most significant bits (MSBs) of the upsampled N-bit digital I and Q digital baseband signals $I_{BB-UP}$ and $Q_{BB-UP}$ (shown as I/Q bit pairs I[0],Q[0], I[1],Q[1], . . . , I[N−1],Q[N−1] in FIG. 8) are converted to thermometer code by a binary-to-thermometer decoder 808, and the resulting thermometer-coded I and Q signals are used to steer the $2^{N_T}-1$ thermometer-coded interleaving RF-DAC unit cells 804. The remaining $N_B$ least significant bits (LSBs) of the upsampled N-bit digital I and Q digital baseband signals $I_{BB-UP}$ and $Q_{BB-UP}$ require no decoding and consequently directly steer the $N_B$ binary-coded RF-DAC unit cells 806. Here, $N=N_T+N_B$ represents the resolution of the interleaving RF-DAC 506. For example, for a resolution of N=9, $N_T=6$, and $N_B=3$, the interleaving RF-DAC 506 would include 63 interleaving thermometer-coded RF-DAC unit cells 804 (each having a current source of the same size $I_0$) and 3 interleaving binary-coded RF-DAC unit cells 806 (with weighted current sources of $I_0/2$, $I_0/4$, and $I_0/8$). It should be mentioned that, although a segmented RF-DAC approach is preferred, since it provides the ability to realize an optimal balance of decoding logic design complexity, layout efficacy, size, linearity, and glitch energy tolerance, a non-segmented approach comprising an all-thermometer-coded RF-DAC array or an all-binary-coded RF-DAC array could be alternatively used.

Figure 9:
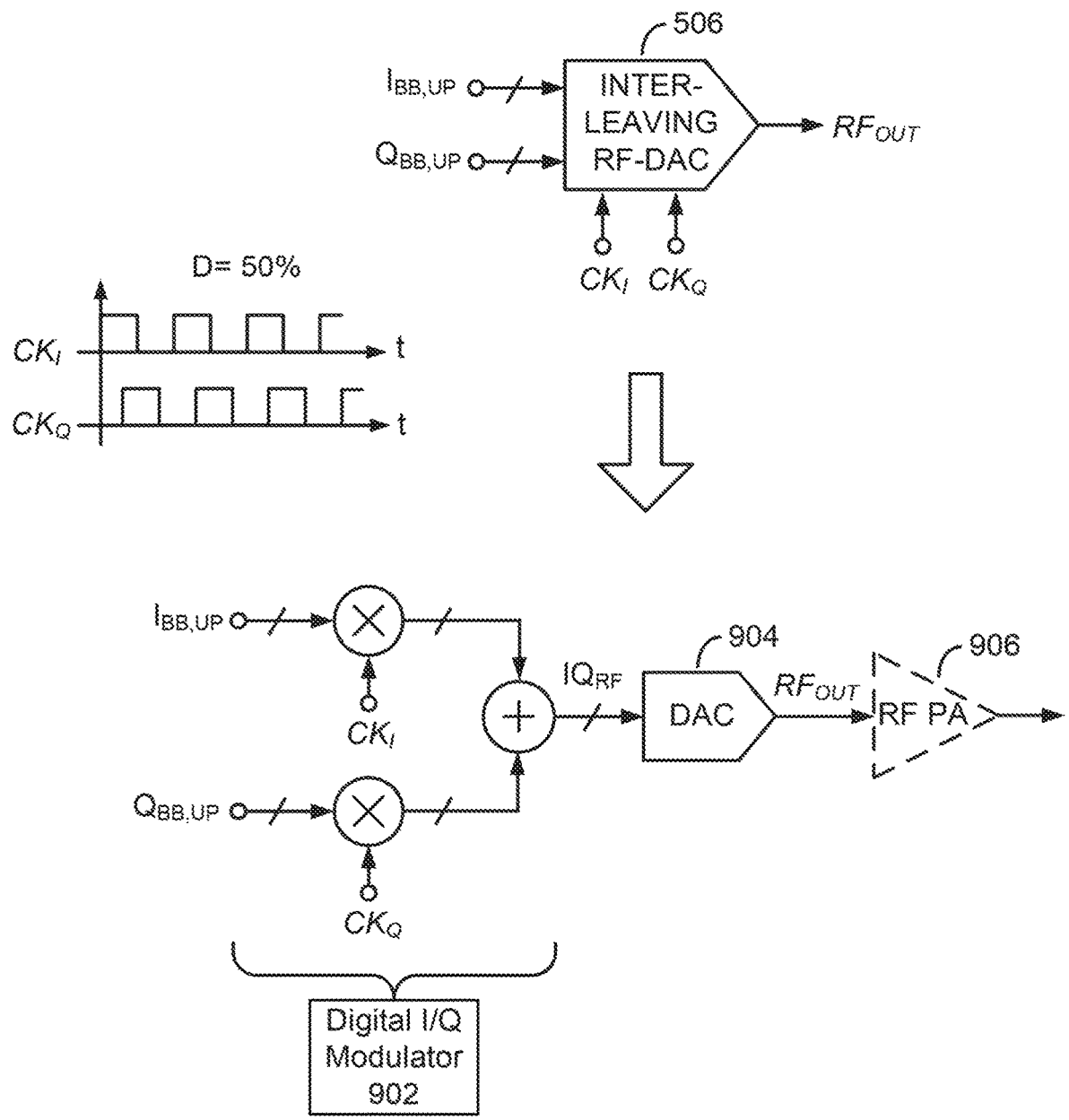
FIG. 9 is a drawing that conceptually illustrates the interleaving, frequency upconversion, and digital-to-analog conversion operations performed by the interleaving RF-DAC in the DDRM of the DTX depicted in FIG. 5.

FIG. 9 is a drawing that illustrates the interleaving, frequency upconversion, and digital-to-analog conversion operations performed by the interleaving RF-DAC 506. Conceptually, the interleaving RF-DAC 506 comprises an N-bit digital I/Q modulator 902 followed by an N-bit current-steering DAC 904. The N-bit digital IQ modulator 902 mixes the upsampled N-bit digital I and Q digital baseband signals $I_{BB-UP}$ and $Q_{BB-UP}$ produced by the interpolation filter 504 with RF in-phase and quadrature LO clocks CK and $CK_Q$ provided by the clock signal generator 508. The I and Q LO clocks CK and $CK_Q$ are 90° out of phase, so the resulting RF-translated signal is an interleaved RF digital IQ signal $IQ_{RF}$. The interleaved RF digital IQ signal $IQ_{RF}$ is then introduced to the current-steering DAC 904, which converts the upconverted digital samples to the final desired modulated analog RF waveform $RF_{OUT}$. (Note that the interleaving RF-DAC 506 may or may not be designed to amplify the analog RF waveform. This design option is indicated in FIG. 9 by the RF PA 906 shown in dashed lines. If desired or necessary, a PA external to the RF-DAC 506 can then be used to amplify (or further amplify) the analog RF waveform $RF_{OUT}$ produced at the output of the RF-DAC 506.)

Figure 1:
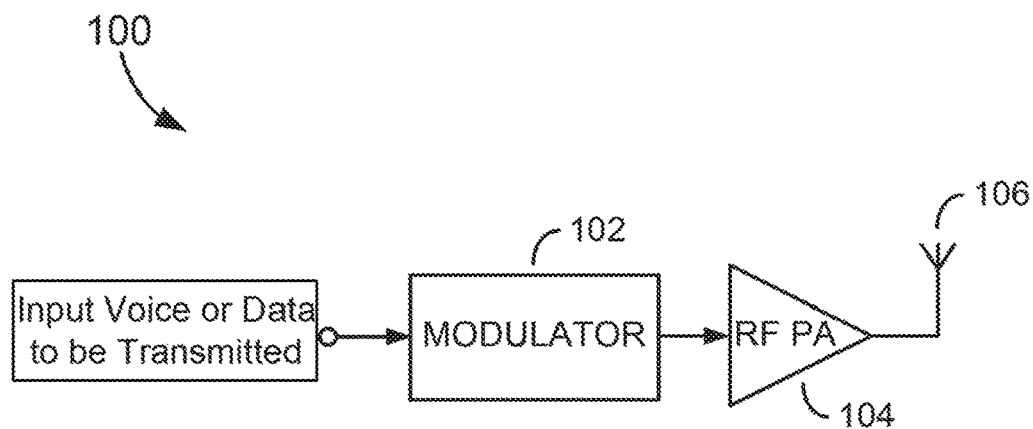
FIG. 1 is a drawing that shows the primary components of a radio frequency (RF) transmitter.
Figure 2:
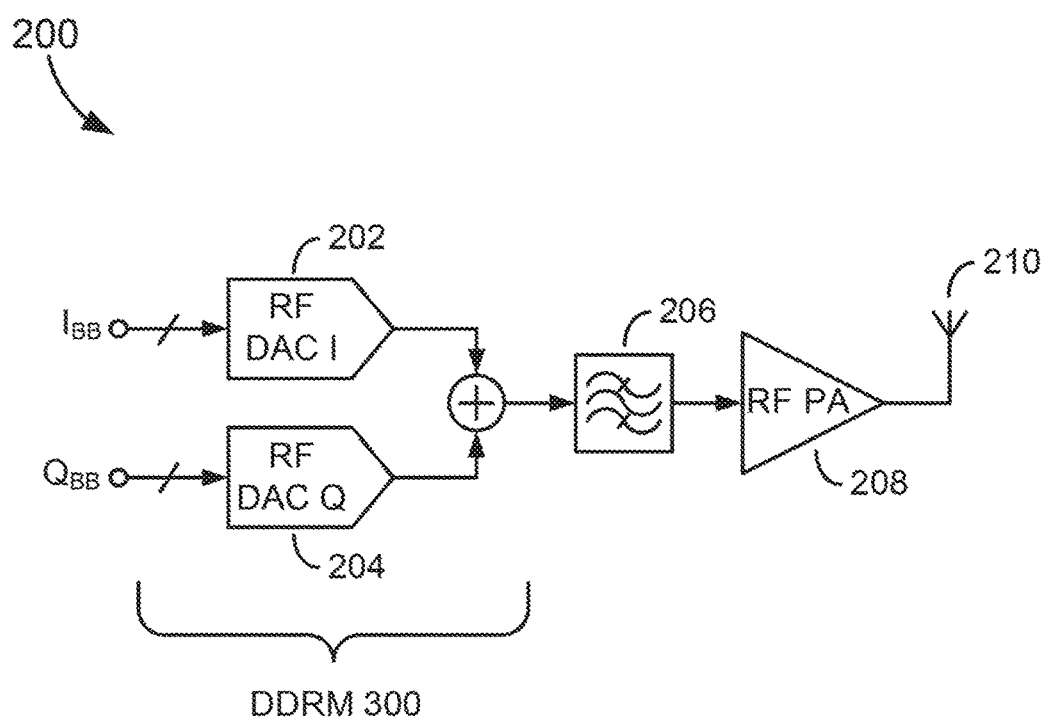
FIG. 2 is drawing that shows the basic components of a prior art digitally-intensive RF transmitter (DTX)
Figure 3:
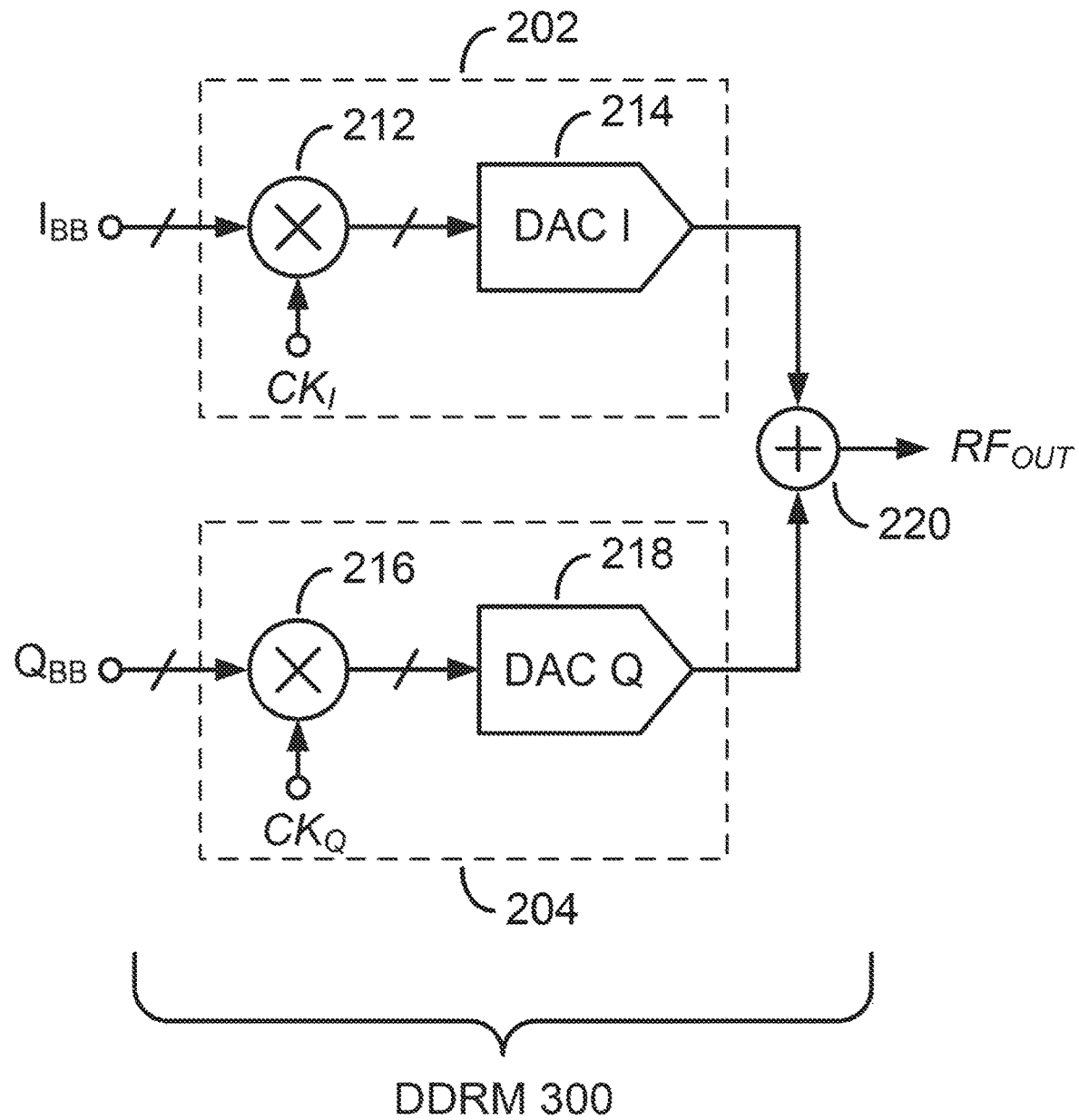
FIG. 3 is a drawing that conceptually illustrates how the in-phase (I) and quadrature (Q) RF-DACs in the direct-digital RF modulator (DDRM) of the DTX depicted in FIG. 2 operate.

One significant advantage the interleaving RF-DAC 506 has over conventional RF-DAC architectures like that depicted in FIGS. 2 and 3 above, is that the I and Q data bits produced by the digital I/Q modulator in each interleaving RF-DAC unit cell are interleaved, i.e., are time-multiplexed. This allows the I and Q bits in the interleaved RF digital IQ signal $IQ_{RF}$ in each RF-DAC unit cell to share the same DAC circuitry (and PA if the RF-DAC 506 is also designed to amplify). Combining the upconverted I and Q signals in the digital domain also effectively reduces the DAC and RF PA resources to half that which is required in conventional, non-interleaved RF-DAC architectures like that depicted in FIGS. 2 and 3. The reduced number of required resources not only provides a more energy efficient solution, it results in a much smaller IC footprint for the overall RF-DAC 506, less parasitics, and better image rejection capability since I-path/Q-path mismatch in each unit cell is practically eliminated.

Figure 10:
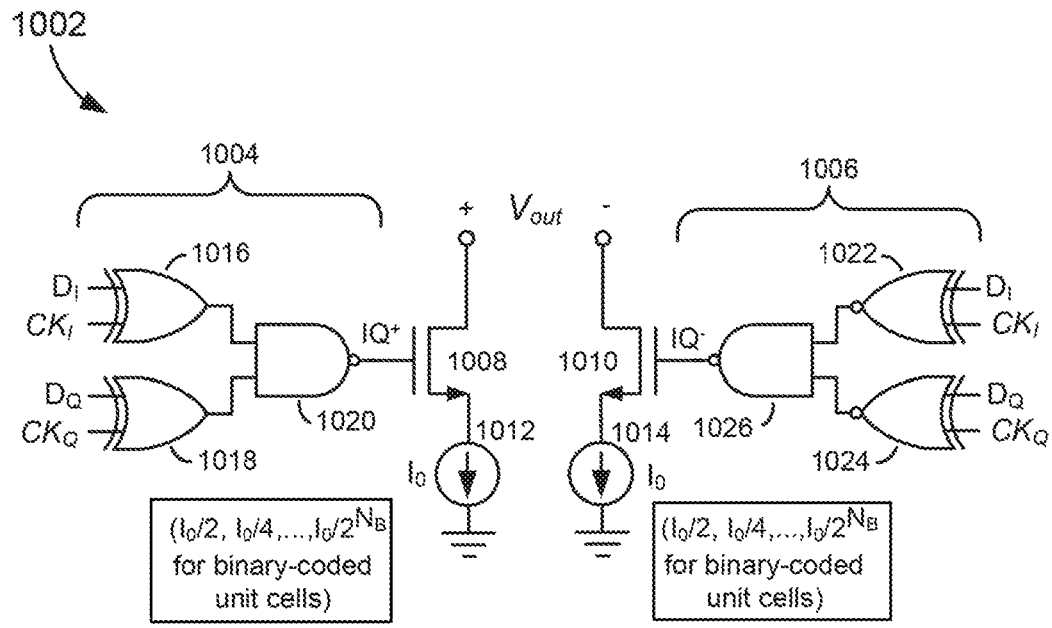
FIG. 10 is a schematic drawing of the circuitry used to implement each of the interleaving RF-DAC unit cells of the interleaving RF-DAC depicted in FIG. 8, in accordance with one embodiment of the invention.

FIG. 10 is a schematic drawing of the actual circuitry used to implement each of the interleaving RF-DAC unit cells in the interleaving RF-DAC 506, in one embodiment of the invention. Each interleaving RF-DAC unit cell 1002 is representative of one of the thermometer-coded interleaving RF-DAC unit cells 804 in the first plurality of interleaving RF-DACs 802A in FIG. 8 or one of the interleaving binary-coded RF-DAC unit cells 806 in the second plurality of interleaving RF-DACs 802B. The interleaving RF-DAC unit cell 1002 includes a first interleaver 1004, a second (complementary) interleaver 1006, first and second switches 1008 and 1010, and first and second current sources 1012 and 1014 connected in series with the first and second switches 1008 and 1010. The first interleaver 1004 comprises first and second exclusive OR (XOR) logic gates 1016 and 1018 and a NAND logic gate 1020 (or their collective De Morgan equivalent), and the second interleaver 1006 comprises first and second exclusive NOR (XNOR) logic gates 1022 and 1024 and a NAND logic gate 1026 (or their collective De Morgan equivalent). The first and second interleavers 1004 and 1006 translate the I and Q data bits $D_I$ and $D_Q$ to RF to produce interleaved RF drive signals $IQ^+$ and $IQ^-$, which control the ON/OFF status of the first and second switches 1008 and 1010. All of the other interleaving RF-DAC unit cells 1002 in the interleaving RF-DAC array 802 operate on their respective I and Q bit streams in a similar manner. The output currents $I_{OUT+}$ and $I_{OUT-}$ of all interleaving RF-DAC unit cells are summed at a common output, similar to as in a conventional current-steering DAC, and the total output current varies depending on the bit patterns in the I and Q bit streams directed to each unit cell, thus allowing the interleaving RF-DAC 506 to produce $2^N$ distinct output levels.

Figure 11:
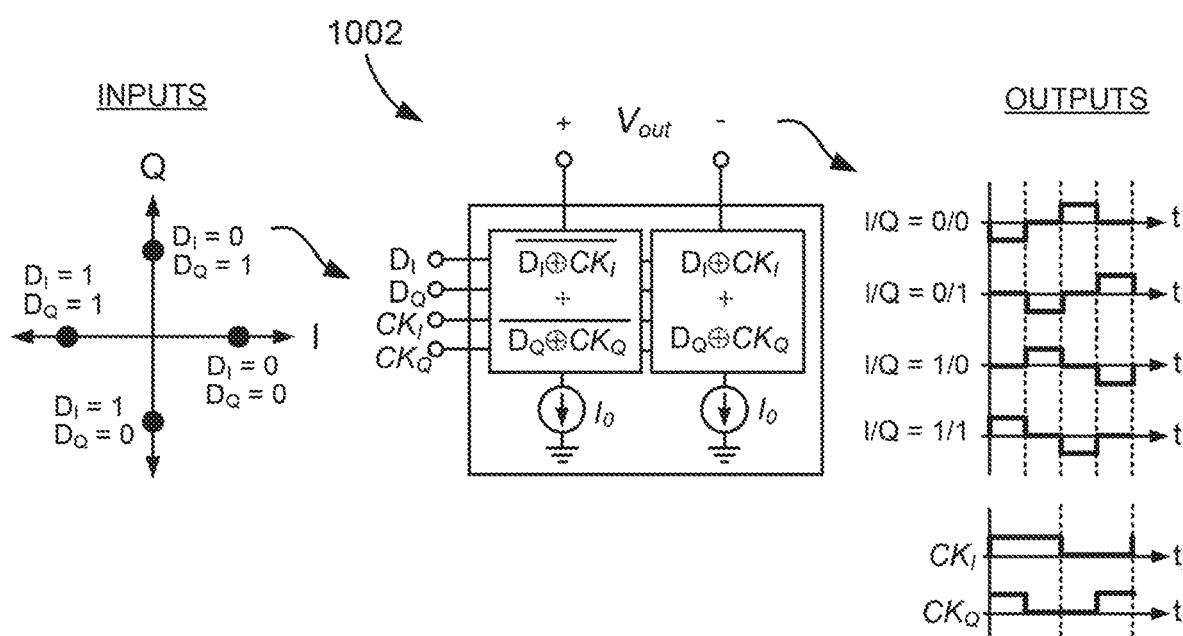
FIG. 11 is a drawing that illustrates how the XOR/OR combinatorial logic of the interleavers in the interleaving RF-DAC unit cell depicted in FIG. 10 is capable of producing four unique, 25% duty cycle, non-overlapping output waveforms covering all four quadrants of the I/Q signal plane.

The I and Q bits applied to each interleaving RF-DAC unit cell 1002 do not have the same value at the same time. It is this exclusivity that allows the I and Q bits to be interleaved (i.e., time-multiplexed) and for the I and Q bits in the interleaved I and Q bit streams to then share the same DAC resources. As shown in FIG. 11, due to the unique XOR/OR combinatorial logic used for the interleavers 1004 and 1006, each interleaving RF-DAC unit cell 1002 is capable of producing four unique, 25% duty cycle, non-overlapping output waveforms covering all four quadrants of the I/Q signal plane, even while using LO clocks $CK_I$ and $CK_Q$ having a duty cycle D=50%. This capability avoids having to introduce complicated clipping circuitry to address I/Q waveform overlap. It also avoids having to generate LO clocks of less than 50%, which is difficult to realize, particularly at GHz frequencies, and which results in a significant increase in power consumption.

Figure 12:
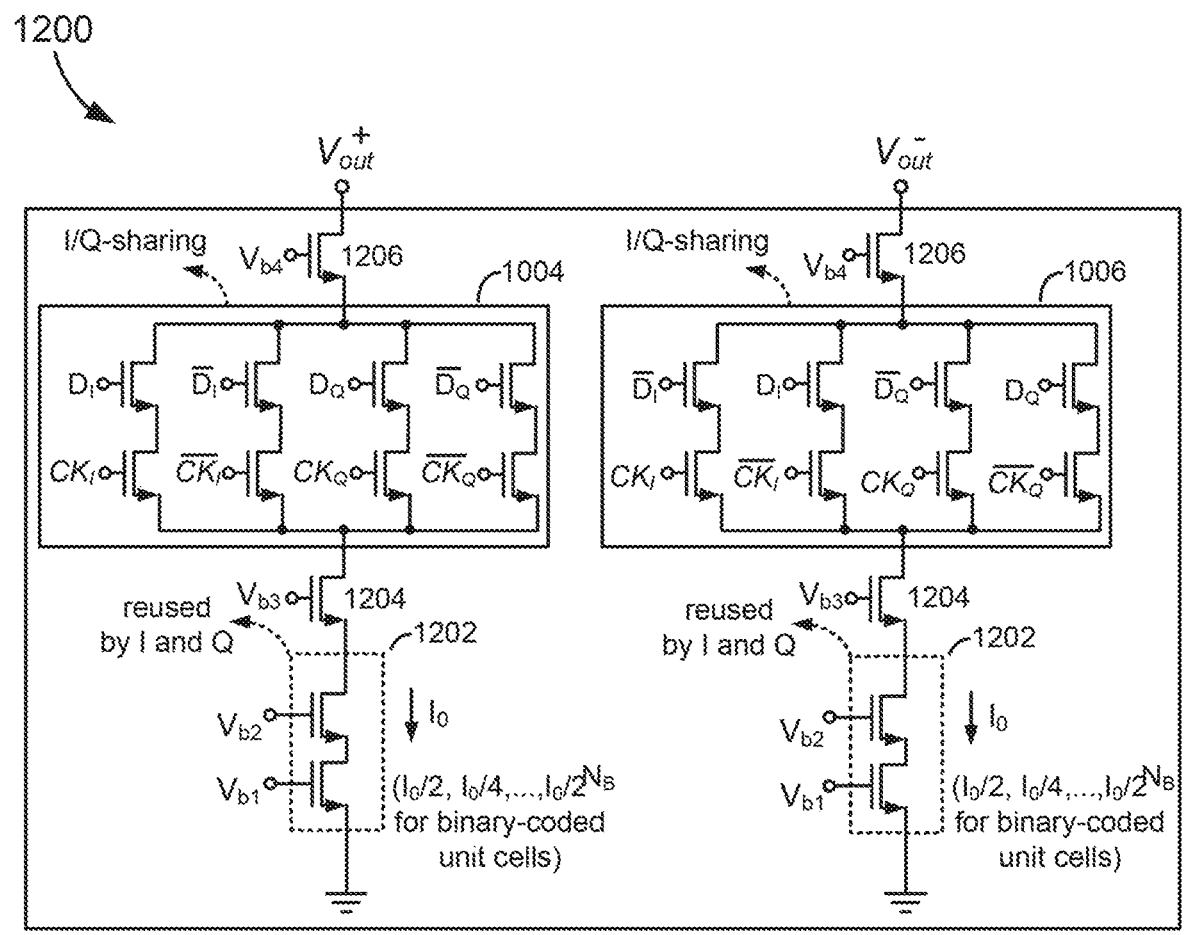
FIG. 12 is a schematic drawing of an interleaving RF-DAC unit cell, in accordance with one embodiment of the invention, that uses current-mode logic to form the XOR/OR combinatorial logic of the interleavers in the interleaving RF-DAC unit cell depicted in FIG. 10.

In one embodiment of the invention the XOR/OR logic of the interleavers 1004 and 1006 is implemented using current-mode logic, by stacking it on top of current sources 1202, as illustrated in the exemplary interleaving RF-DAC unit cell 1200 depicted in FIG. 12. Stacking the XOR/OR current-mode logic on top of the current sources 1202 allows faster switching operation. It also allows the I and Q bits in each complementary IQ-interleaved bit stream to share the same current source (i.e., to "reuse" the current $I_0$), resulting in a smaller unit-cell size and lower power consumption than if sharing was not possible. Transistors 1204 in the unit cell 1200 serve to shield the switching transistors in the XOR/OR current-mode logic from parasitic capacitances present on the drains of the current sources 1202 and consequently help to achieve and maintain linearity at high frequencies. Thick-oxide cascode transistors 1206 above the current-mode logic interleavers 1004 and 1006 are employed to withstand large voltage swings at the output nodes and to reduce interaction between DAC branches. Alternatively, a global cascoding approach using global cascode transistors 1302 may be used, as illustrated in FIG. 13.

Figure 13:
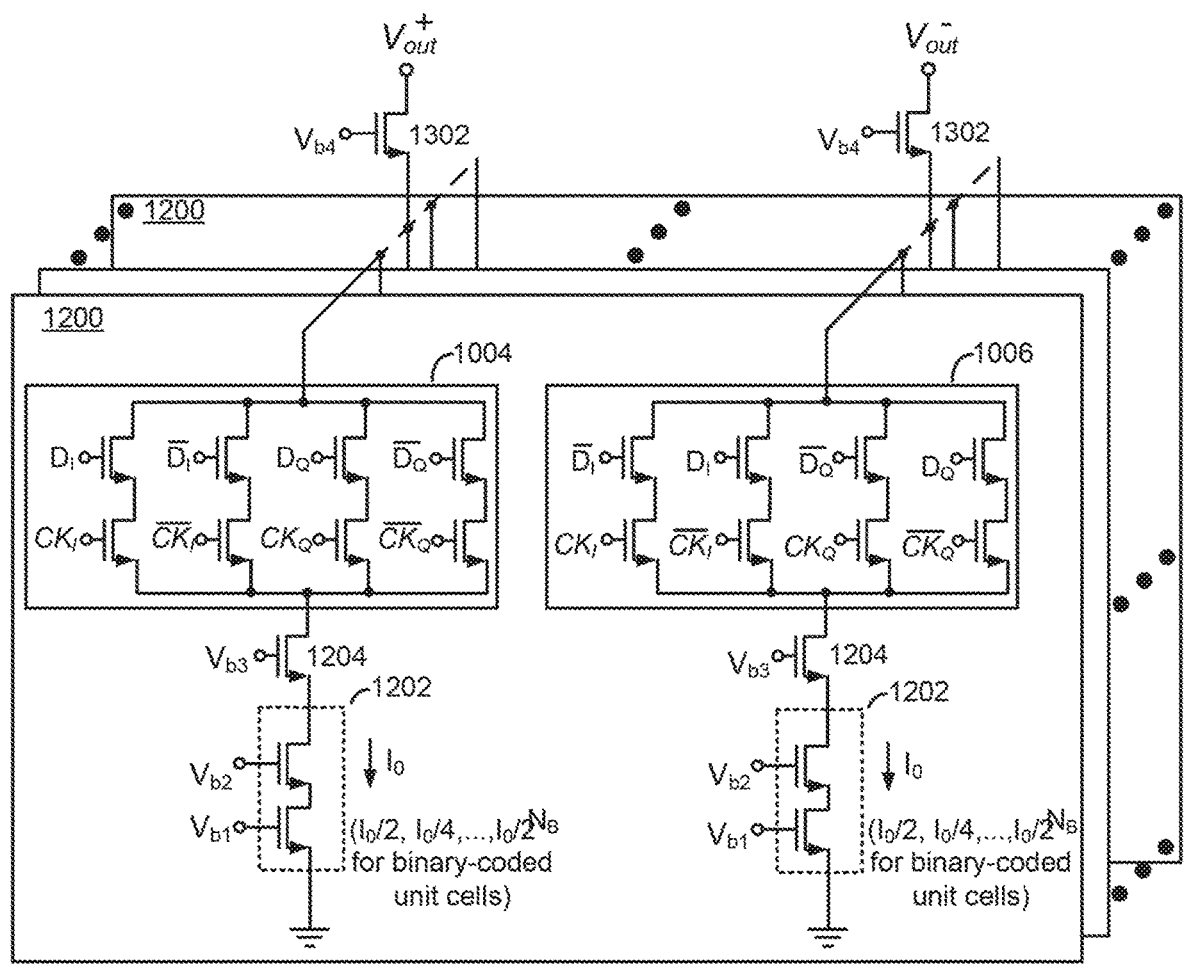
FIG. 13 is a schematic drawing of an interleaving RF-DAC, in accordance with another embodiment of the invention, that utilizes a global cascoding approach, instead of the local cascoding approach used by the RF-DAC unit cell depicted in FIG. 12.
Figure 14:
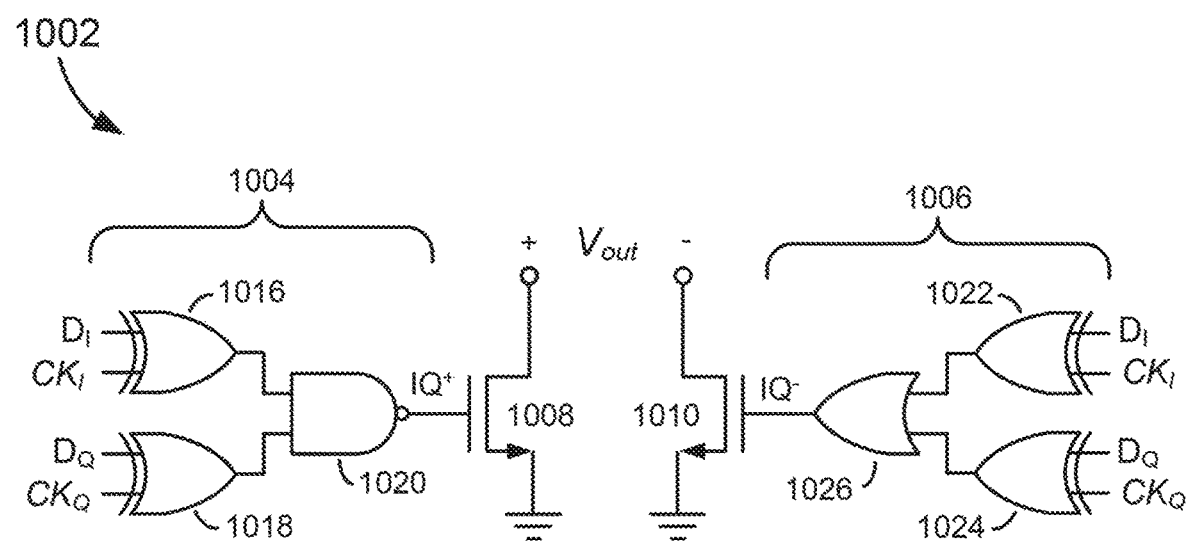
FIG. 14 is a schematic drawing of an interleaving RF-DAC, in accordance with another embodiment of the invention, that relies on the ON and OFF resistances of switching transistors 1402 to perform digital-to-analog conversion and does not require the use of current sources.
Figure 15:
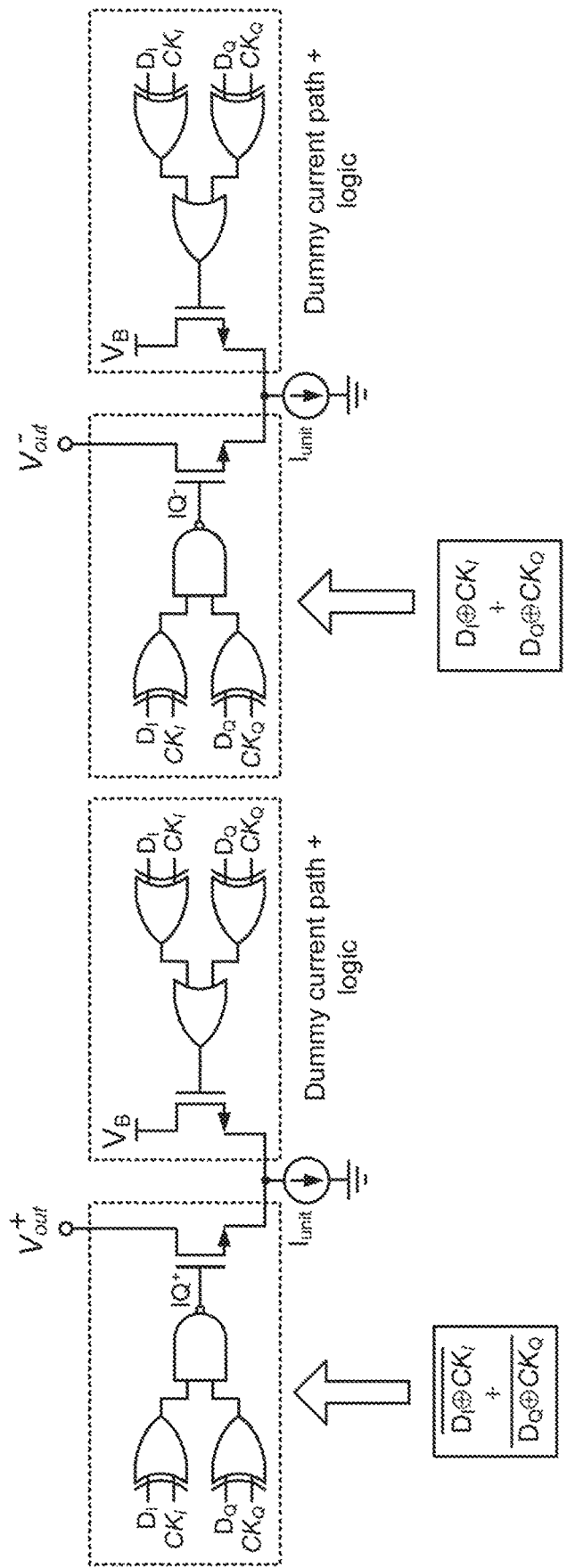
FIG. 15 is a schematic drawing of an interleaving RF-DAC unit cell, in accordance with another embodiment of the invention, that uses fully-differential switched current sources, rather than the pseudo-differential switched current source approaches used by the exemplary RF-DAC unit cells depicted in FIGS. 12-14.

The interleaving RF-DAC unit cells depicted in FIGS. 12 and 13 employ what may be referred to as "pseudo-differential" switched current sources. An advantage of this pseudo-differential switched-current approach is that it reduces the number of logic gates required for each complementary half of each interleaving RF-DAC unit cell. Unit cell size could be further reduced by eliminating the current sources and relying instead on the difference between the ON and OFF resistance of switching transistors 1402, as illustrated in FIG. 14. According to that approach, the drains of all switching transistors 1402 in the RF-DAC array share the same output and those switching transistors 1402 that are switched ON at any given time are connected in parallel. Hence, depending on whether the transistors 1402 in each cell are ON or OFF, as determined by whether the values of the I and Q bits in their respective interleaved IQ data streams is high or low, the RF-DAC array 802 would then produce an analog RF waveform having a bit-to-bit amplitude that depends on the summed output conductances of all RF-DAC unit cells in the array 802. While the pseudo-differential/switched resistor approach in FIG. 14 has a size advantage because of not requiring current sources, the pseudo-differential/shared current source approach in FIG. 12 or FIG. 13 is preferred since by using current sources the output resistance of the RF-DAC array remains essentially constant, i.e., does not vary significantly depending on the bit patterns of the I and Q bits in the RF-DACs' interleaved IQ data streams. Finally, it should be mentioned that, although the pseudo-differential approach in FIG. 12 or FIG. 13 is preferred, a fully-differential approach with fully-differential switched current sources, such as depicted in FIG. 15, could be alternatively used. (Note that the XOR/OR logic used for the interleavers in FIG. 15 could be constructed using XOR/OR current-mode-logic, similar to as explained above, without any current sources at the bottoms of the associated logic gate.)

Figure 4A:
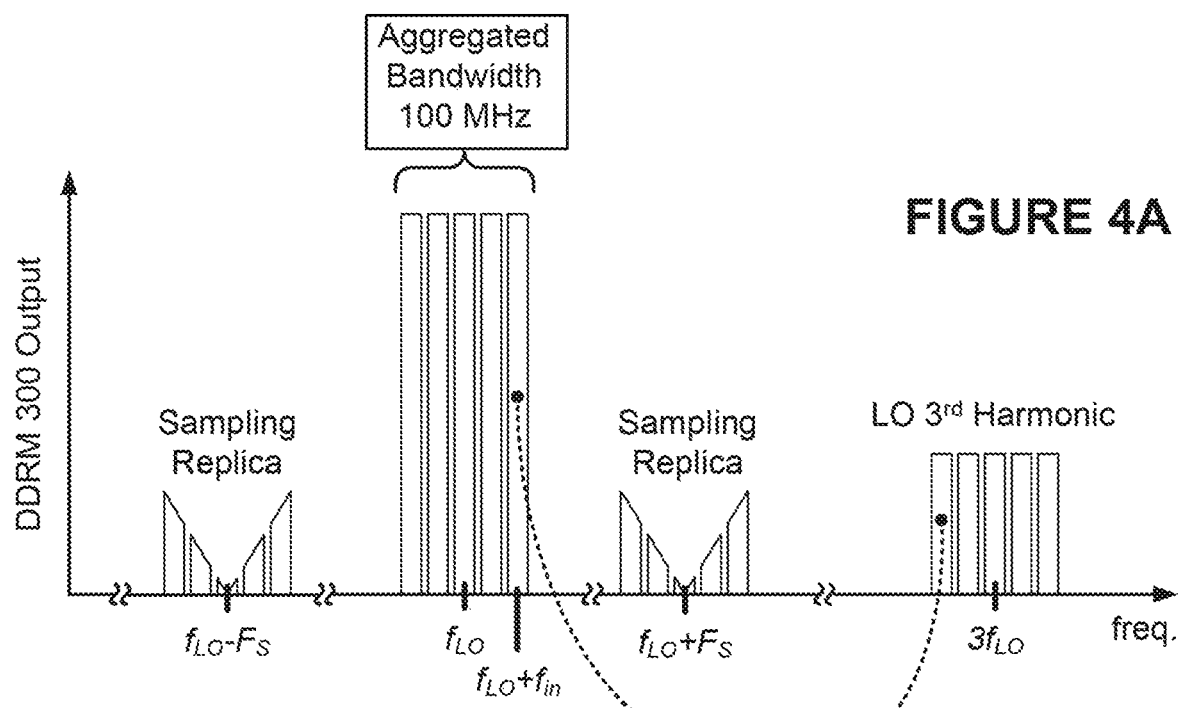
FIG. 4A is a simplified drawing of the DDRM output RF spectrum that can result when a DDRM is operated without baseband and RF filters in a wideband or multi-band, carrier aggregation environment, such as Long Term Evolution Advanced (LTE-Advanced)
Figure 4B:
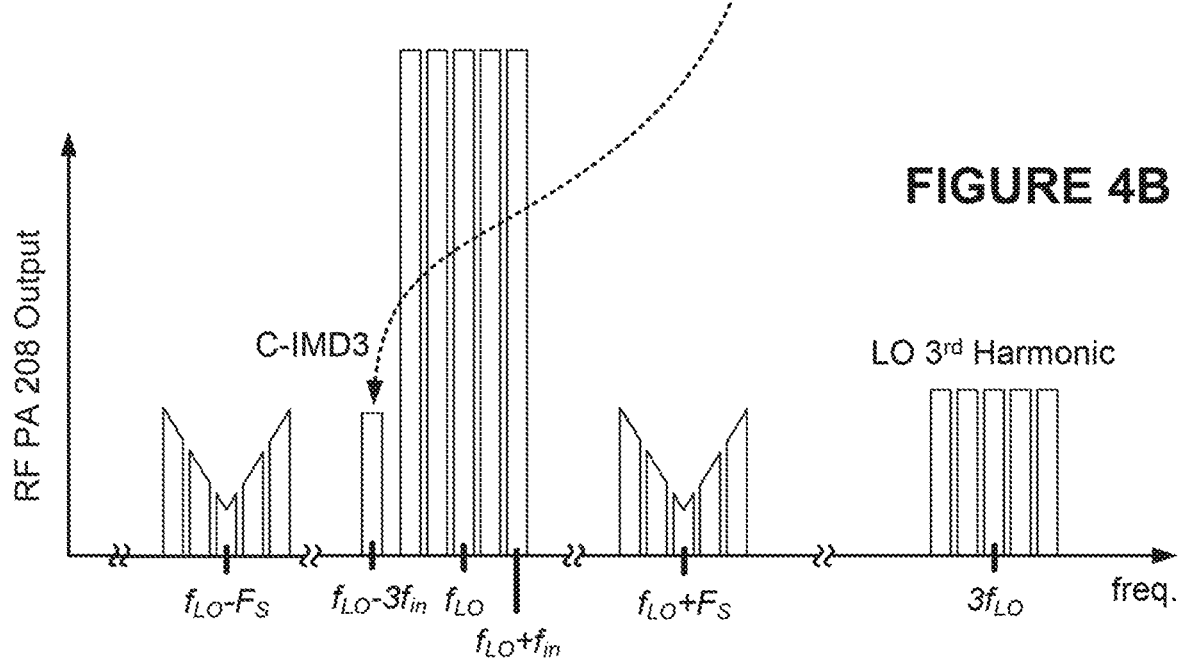
FIG. 4B is a simplified drawing of an output RF spectrum that can appear at the output of the RF power amplifier (RF PA) of a DTX like that depicted in FIG. 2 when the DTX and its DDRM are operated without baseband and RF filters in a wideband or multi-band, carrier aggregation environment, highlighting how local oscillator (LO) $3^{rd}$ harmonics produced by the DDRM can intermodulate with the LO fundamental component when passing through the RF PA and produce undesirable counter-intermodulation distortion (C-IMD3)
Figure 16:
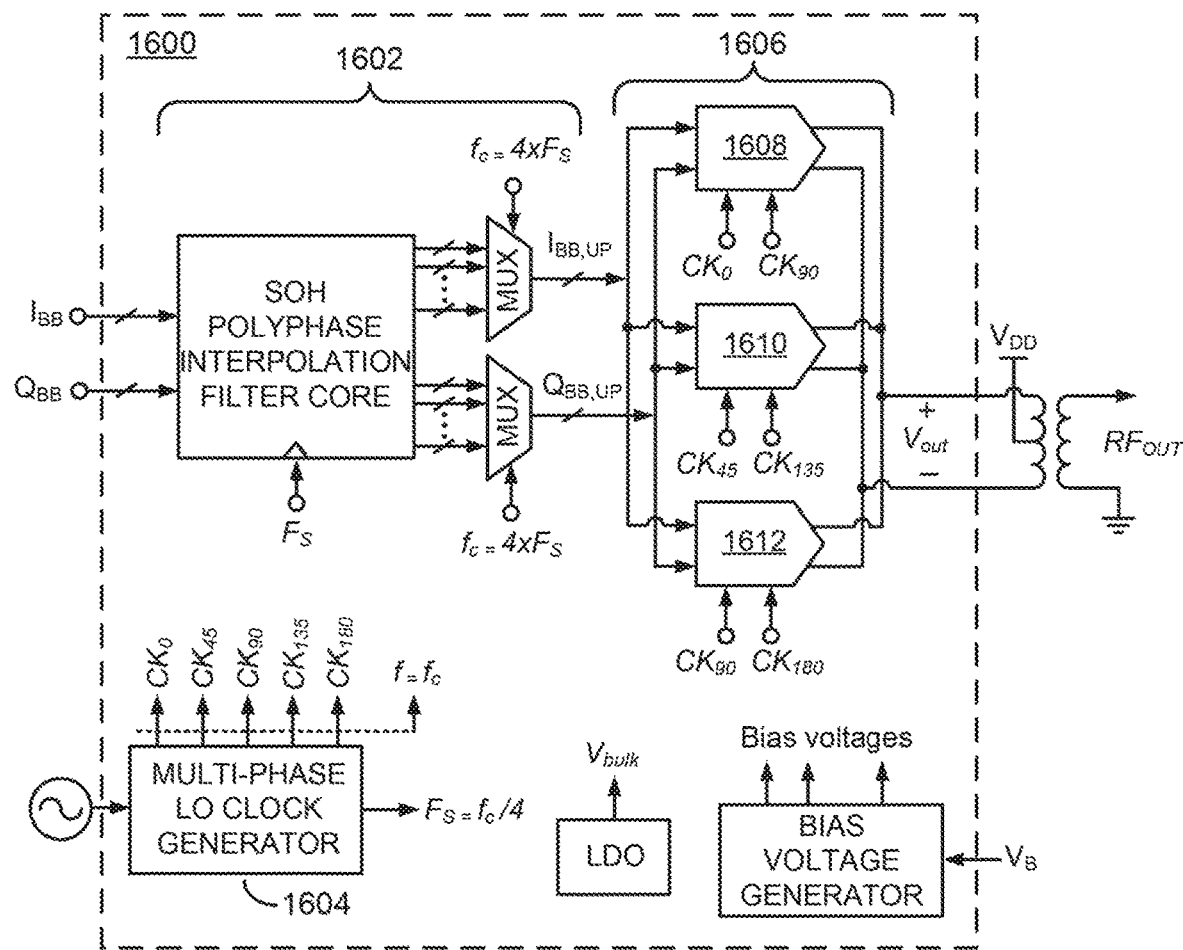
FIG. 16 is a drawing depicting a DDRM that utilizes an LO harmonic cancellation technique to suppress third- and fifth-order LO harmonics, in accordance with another embodiment of the invention.

The DDRM 502 described above provides an acceptable solution for some applications. However, it does not address the problem of LO harmonic emissions caused by the switching logic (e.g., by the interleavers 1004 and 1006 in the interleaving RF-DAC unit cells). As was explained above in reference to FIG. 4A, LO-harmonic-related emissions are undesirable since they contribute to out-of-band noise and make it difficult to comply with out-of-band emission requirements. In conventional DDRM approaches, pre-PA and/or post-PA band-pass filter (BPFs) is/are typically employed in an effort to suppress the LO harmonics. Unfortunately, the RF BPFs are not entirely effective at suppressing the LO harmonic emissions. Moreover, because the RF BPFs are not entirely effective, $3^{rd}$-order LO harmonic counter-intermodulation distortion (C-IMD3) results, as was illustrated in FIG. 4B. FIG. 16 is a drawing depicting a DDRM 1600 according to another embodiment of the invention that addresses these problems, without having to rely on the unsatisfactory performance of pre-PA and post-PA RF BPFs. The DDRM 1600 comprises an interpolation filter 1602 (in this exemplary embodiment a SOH polyphase interpolation filter similar to that described above in reference to FIGS. 6 and 7); a multi-phase LO clock signal generator 1604; and an RF-DAC 1606 comprised of three parallel-connected interleaving RF-DACs 1608, 1610 and 1612. (Note that non-interleaving RF-DACs may be used in this embodiment of the invention, i.e., instead of interleaving RF-DACs 1608, 1610 and 1612; however the interleaving RF-DACs 1608, 1610 and 1612 are preferred due to the various advantages that they offer.) Comparing FIG. 16 to FIG. 5, it is seen that the DDRM 1600 is similar in construction to the DDRM 502, except that the interleaving RF-DAC 1606 is constructed from a plurality of parallel-connected interleaving RF-DACs 1608, 1610 and 1612 that operate in accordance with a multi-phase set of LO clock signals: $CK_{0/90}$, $CK_{45/135}$ and $CK_{90/180}$, rather than a single interleaving RF-DAC 506 operating in accordance with I and Q LO clocks $CK_I$ and $CK_Q$. Each of the three interleaving RF-DACs 1608, 1610 and 1612 may be constructed using any one of the various unit cell architectures described above. Note that if a global cascoding architecture is adopted (for example similar to as the unit cell depicted in FIG. 13), the three global cascode transistor pairs of the parallel-connected RF-DACs 1608, 1610 and 1612 can be merged into a single cascode transistor pair.

Figure 17:
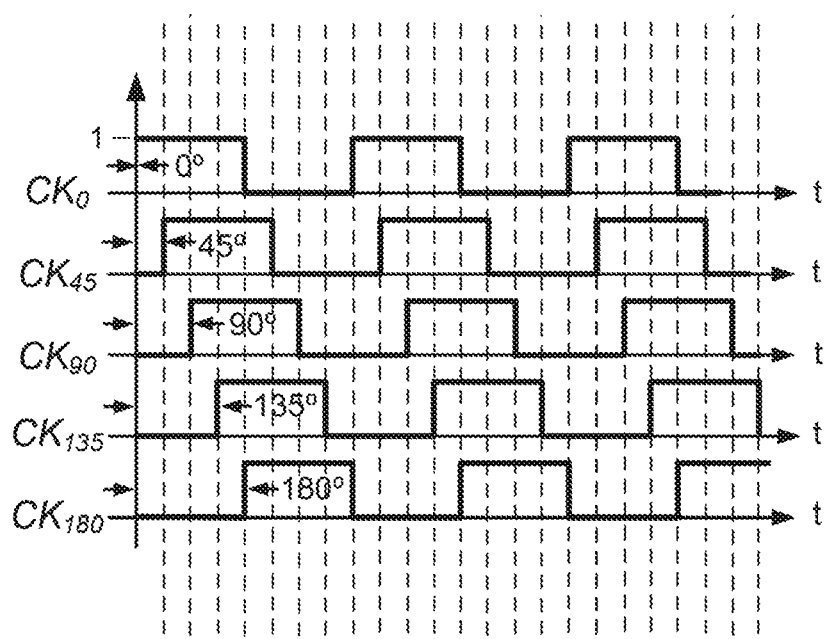
FIG. 17 is a signal diagram showing the phase relationships among the multi-phase set of LO clock signals $CK_{0/90}$, $CK_{45/135}$ and $CK_{90/180}$ produced by the multi-phase LO clock signal generator of the DDRM depicted in FIG. 16.
Figure 18:
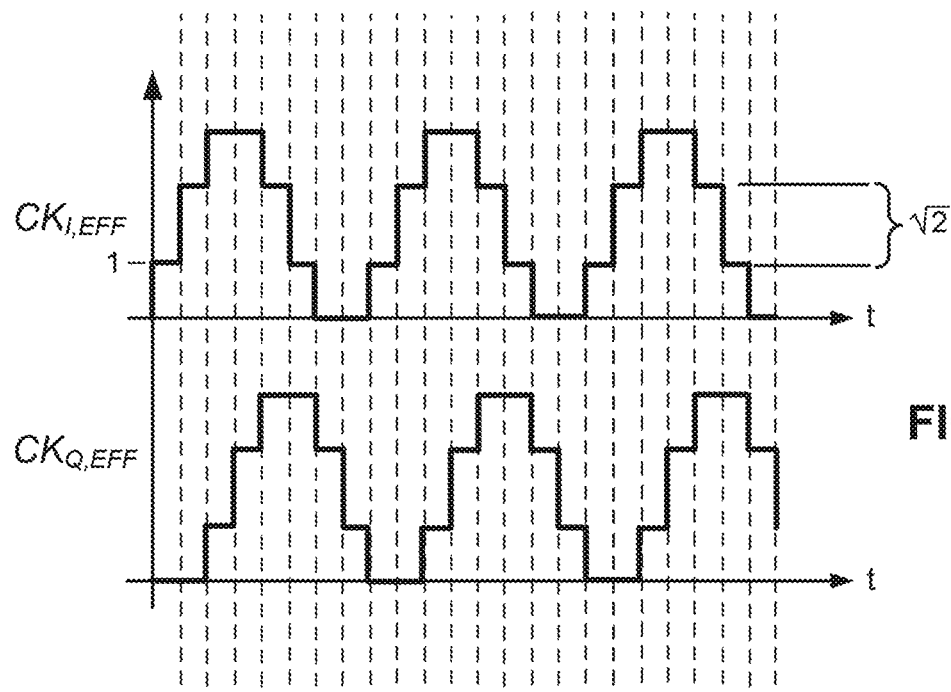
FIG. 18 is a signal diagram illustrating how controlling the three interleaving RF-DACs in the DDRM depicted in FIG. 16 by the multi-phase set of LO clock signals $CK_{0/90}$, $CK_{45/135}$ and $CK_{90/180}$ is, in effect, equivalent to controlling a single interleaving RF-DAC by a single quantized pair of in-phase and quadrature sinusoids.

FIG. 17 is a signal diagram showing the phase relationships among the multi-phase set of LO clock signals: $CK_{0/90}$, $CK_{45/135}$ and $CK_{90/80}$. The LO clock signals $CK_0$, $CK_{45}$ and $CK_{90}$ are the in-phase clocks applied to the I inputs of the interleaving RF-DACs 1608, 1610 and 1612 and the LO clock signals $CK_{90}$, $CK_{135}$, $CK_{180}$ are the quadrature clocks applied to the Q inputs of the interleaving RF-DACs 1608, 1610 and 1612. Each of the in-phase LO clock signals $CK_0$, $CK_{45}$ and $CK_{90}$ has a 45° phase difference with respect to the other two in-phase LO clock signals. Similarly, each of the quadrature LO clock signals $CK_{90}$, $CK_{135}$, $CK_{180}$ has a 45° phase difference with respect to the other two quadrature LO clock signals. Because the three interleaving RF-DACs 1608, 1610 and 1612 are connected in parallel, controlling the three interleaving RF-DACs 1608, 1610 and 1612 according to the multi-phase set of LO clock signals: $CK_{0/90}$, $CK_{45/135}$ and $CK_{90/180}$ is, in effect, equivalent to controlling a single interleaving RF-DAC by a single quantized pair of in-phase and quadrature sinusoids, such as illustrated in FIG. 18.

Figure 19:
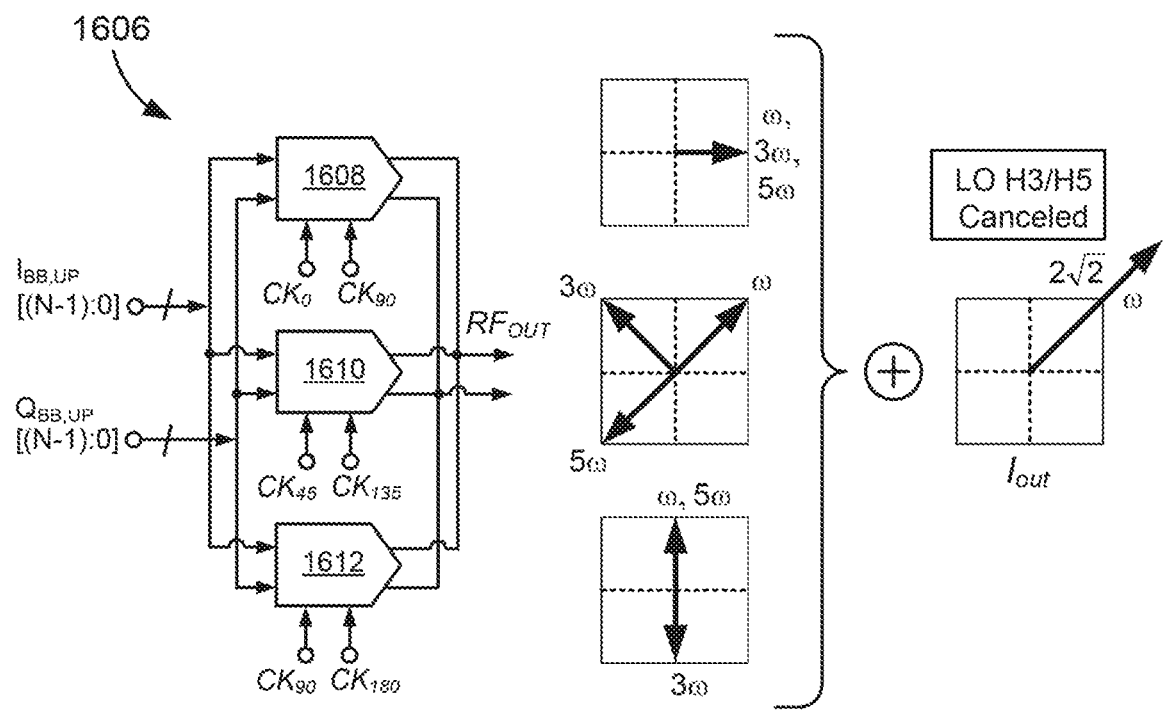
FIG. 19 is a drawing that vectorially illustrates the LO cancellation technique performed by the parallel-connected RF-DACs of the DDRM depicted in FIG. 16.

It can be shown that when each of the in-phase LO clock signals $CK_0$, $CK_{45}$ and $CK_{90}$ and each of the quadrature LO clock signals $CK_{90}$, $CK_{135}$, $CK_{180}$ is expressed in a Fourier series and summed the $3^{rd}$-order and $5^{th}$-order harmonics cancel. This LO cancellation is illustrated vectorially in the vector diagrams in FIG. 19, where the $3^{rd}$-order and $5^{th}$-order harmonics are referred to by their angular frequencies $3_\omega$ and $5_\omega$. Canceling the $3^{rd}$-order and $5^{th}$-order harmonics $3_\omega$ and $5_\omega$ leaves only the desired copy of the upconverted baseband signal centered at the fundamental frequency $\omega = f_{LO} \times 2\pi$. (Note that to resemble a sinusoid as best possible, the magnitude of the current source used in the middle interleaving RF-DAC 1610 is scaled by a factor of $\sqrt{2}$. Alternatively, this $\sqrt{2}\times$ multiplying operation can be performed in the corresponding I/Q baseband signals, in which case the magnitude of the middle current source would be the same as the others.)

It should be mentioned that the LO cancellation technique described above is not limited to cancelling $3^{rd}$-order and $5^{th}$-order harmonics, in other words, can be extended to cancel higher-order harmonics. For example, $7^{th}$-order to $15^{th}$-order harmonics could be canceled by using a set of eight multi-phase LO clock signals.

Figure 20:
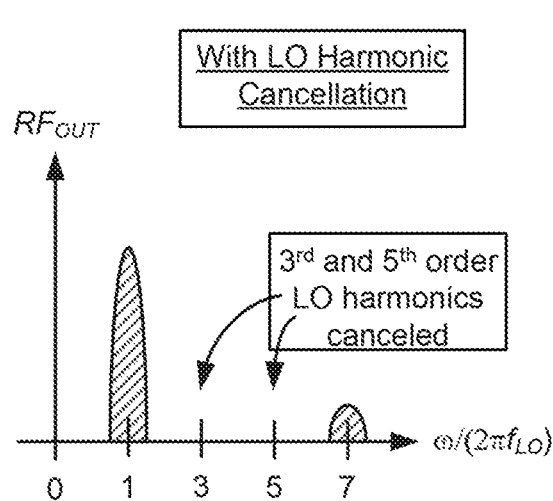
FIG. 20 is an idealized output RF spectrum of the DDRM depicted in FIG. 16, highlighting how the LO cancellation technique performed by the parallel-connected RF-DACs of the DDRM serves to cancel copies of the baseband signal that would otherwise appear in the output frequency spectrum.
Figure 21:
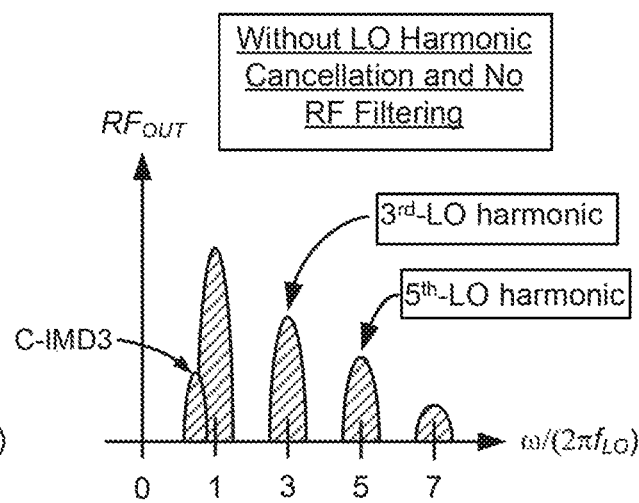
FIG. 21 depicts an output RF spectrum of a DTX that lacks any RF filtering or LO cancellation capability, highlighting how the presence of the third-order LO harmonic at the input of the DTX's RF PA results in undesirable C-IMD3 near the intended/desired transmission band.

FIG. 20 shows an idealized output frequency spectrum produced at the output of the parallel-connected RF-DAC 1606, highlighting how controlling the parallel-connected RF-DAC 1608, 1610 and 1612 by the multi-phase set of LO clock signals: $CK_{0/90}$, $CK_{45/135}$ and $CK_{90/180}$ serves to cancel the copies of the baseband signal that would otherwise appear in the output DDRM's output RF spectrum. By using the LO harmonic cancellation technique the need for pre-PA and post-PA RF BPFs is obviated (or at least simplifies the design complexity of any RF BPFs that may be used). Moreover, since the $3^{rd}$ LO harmonic is canceled, C-IMD3, which would otherwise be generated due to intermodulation of the fundamental and $3^{rd}$ LO harmonic components in the DDRM's external RF PA, is almost completely avoided. In the absence of any RF filtering and LO cancellation, a DTX output RF spectrum similar to that depicted in FIG. 21 would be produced.

While various embodiments of the present invention have been presented, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments of the invention but, instead, should be determined by the appended claims, including the full scope of equivalents to which such claims are entitled.

The invention claimed is:

1. A digital radio frequency (RF) modulator, comprising:
an interpolation filter configured to upsample input I and Q digital baseband signals $I_{BB}$ and $Q_{BB}$ of sample rate $F_S$ to upsampled I and Q digital baseband signals $I_{BB,UP}$ and $Q_{BB,UP}$ of upsampled rate $M \times F_S$, where M is an upsampling factor greater than one;
a local oscillator (LO) clock signal generator configured to generate in-phase (I) and quadrature LO clock signals; and
an interleaving RF digital-to-analog converter (RF-DAC) including a plurality of interleaving RF-DAC unit cells, each interleaving RF-DAC unit cell including first and second interleavers configured to upconvert and interleave I and Q bits in the upsampled I and Q digital baseband signals $I_{BB,UP}$ and $Q_{BB,UP}$, in accordance with the I and Q LO clock signals,
wherein the first and second interleavers of each interleaving RF-DAC unit cell comprises combinatorial logic that provides each interleaving RF-DAC unit cell the ability to generate four unique, non-overlapping I/Q waveforms covering all four quadrants of the I/Q signal plane.

2. The digital RF modulator of claim 1, wherein the I and Q LO clock signals generated by the LO clock signal generator have a duty cycle of 50%.

3. The digital RF modulator of claim 1, wherein:
the combinatorial logic used in the first interleaver of each interleaving RF-DAC unit cell comprises a first exclusive NOR (XNOR) logic gate configured to receive the I LO clock signal and I bits in the upsampled I and Q digital baseband signals $I_{BB,UP}$ and $Q_{BB,UP}$, a second XNOR logic gate configured to receive the Q LO clock signal and Q bits in the upsampled I and Q digital baseband signals $I_{BB,UP}$ and $Q_{BB,UP}$, and a first OR logic gate with inputs connected to the outputs of the first and second XNOR logic gates, or the De Morgan equivalent of the combination of first and second XNOR logic gates and first OR logic gate, and
the combinatorial logic used in the second interleaver of each interleaving RF-DAC unit cell comprises a first exclusive OR (XOR) logic gate configured to receive the I LO clock signal and I bits in the upsampled I and Q digital baseband signals $I_{BB,UP}$ and $Q_{BB,UP}$, a second XOR logic gate configured to receive the Q LO clock signal and Q bits in the upsampled I and Q digital baseband signals $I_{BB,UP}$ and $Q_{BB,UP}$, and a second OR logic gate with inputs connected to the outputs of the first and second XOR logic gates, or the De Morgan equivalent of the combination of first and second XOR logic gates and second OR logic gate.

4. The digital RF modulator of claim 1, wherein each interleaving RF-DAC unit cell further includes first and second current sources controlled by complementary interleaved digital RF signals $IQ^+$ and $IQ^-$ produced by the first and second interleavers.

5. The digital RF modulator of claim 4, wherein the first and second current sources are fully-differential current sources.

6. The digital RF modulator of claim 4, wherein the combinatorial logic of the first and second interleavers comprises current-mode logic.

7. The digital RF modulator of claim 1, wherein each RF-DAC unit cell further includes first and second transistors that serve as switched resistors and which are controlled by complementary interleaved digital RF signals $IQ^+$ and $IQ^-$ produced by the first and second interleavers.

8. The digital RF modulator of claim 1, wherein the interpolation filter comprises a $2^{nd}$-order hold (SOH) or higher-order hold polyphase interpolation filter with upsampling factor M.

9. The digital RF modulator of claim 8, wherein the SOH or higher-order hold polyphase interpolation filter comprises a plurality parallel sub-filters that operate at sample rate $F_S$ and I and Q output multiplexers that operate at upsampled rate $M \times F_S$.

10. The digital RF modulator of claim 1, wherein the RF-DAC comprises a plurality of RF-DACs connected in parallel, the LO clock signal generator comprises a multi-phase LO clock signal generator, and the plurality of parallel-connected RF-DACs is controlled by the multi-phase LO clock signal generator to cancel or substantially suppress LO harmonic emissions.

11. A digital radio frequency (RF) modulator, comprising:
a multi-phase local oscillator (LO) clock signal generator; and
a plurality of RF digital-to-analog converters (RF-DACs) connected in parallel configured to upconvert digital input I and Q baseband signals to RF and produce an analog RF waveform from the upconverted RF digital I and Q signals,
wherein the plurality of parallel-connected RF-DACs is controlled by the multi-phase LO clock signal generator to cancel or substantially suppress LO harmonic emissions,
wherein:
the multi-phase LO clock signal generator is configured to generate a first pair of in-phase (I) and quadrature (Q) LO clock signals, a second pair of I and Q LO clock signals that is forty-five degrees out of phase with respect to the first pair of I and Q LO clock signals, and a third pair of I and Q LO clock signals that is forty-five degrees out of phase with respect to the second pair of I and Q LO clock signals,
the plurality of parallel-connected RF-DACs includes first, second, and third parallel-connected RF-DACs, and
the first RF-DAC is controlled by the first pair of I and Q LO clock signals, the second RF-DAC is controlled by the second pair of I and Q LO clock signals, and the third RF-DAC is controlled by the third pair of I and Q LO clock signals to cancel or substantially suppress $3^{rd}$-order and $5^{th}$-order LO emissions.

12. The digital RF modulator of claim 11, wherein each of the RF-DACs in the plurality of parallel-connected RF-DACs comprises an interleaving RF-DAC having a plurality of interleaving RF-DAC unit cells.

13. The digital RF modulator of claim 11, wherein the multi-phase LO clock signal generator is configured to generate a multi-phase set of LO clock signals, each having a duty cycle of 50%.

14. The digital RF modulator of claim 11, wherein the I and Q LO clock signals have a duty cycle of 50% and each RF-DAC unit cell comprises combinatorial logic that provides each RF-DAC unit cell the ability to generate four unique, non-overlapping I/Q waveforms covering all four quadrants of the I/Q signal plane.

15. The digital RF modulator of claim 12, wherein each interleaving RF-DAC unit cell comprises:
a first interleaver including a first exclusive NOR (XNOR) logic gate, a second XNOR logic gate, and a first OR logic gate with inputs connected to the outputs of the first and second XNOR logic gates, or the De Morgan equivalent of the combination of first and second XNOR logic gates, and first OR logic gate; and
a second interleaver including a first exclusive OR (XOR) logic gate, a second XOR logic gate, and a second OR logic gate with inputs connected to the outputs of the first and second XOR logic gates, or the De Morgan equivalent of the combination of first and second XOR logic gates, and second OR logic gate.

16. The digital RF modulator of claim 15, wherein each interleaving RF-DAC unit cell further includes first and second current sources controlled by complementary interleaved digital RF signals $IQ^+$ and $IQ^-$ produced by the first and second interleavers.

17. The digital RF modulator of claim 11, further comprising an interpolation filter configured to upsample the digital input I and Q baseband signals to an upsampled rate of upsampling factor M×sample rate $F_S$ before being directed to the first, second, and third parallel-connected RF-DACs.

18. The digital RF modulator of claim 17, wherein the interpolation filter comprises a $2^{nd}$-order hold (SOH) or higher-order hold polyphase interpolation filter.

19. The digital RF modulator of claim 18, wherein the SOH or higher-order hold polyphase interpolation filter comprises a plurality of sub-filters connected in parallel that operate at sample rate $F_S$ and I and Q output multiplexers that operate at upsampled rate $M \times F_S$.

\* \* \* \* \*